United States Patent
Pham et al.

(10) Patent No.: US 7,362,615 B2
(45) Date of Patent: Apr. 22, 2008

(54) METHODS FOR ACTIVE BOOSTING TO MINIMIZE CAPACITIVE COUPLING EFFECT BETWEEN ADJACENT GATES OF FLASH MEMORY DEVICES

(75) Inventors: Tuan D. Pham, San Jose, CA (US); Masaaki Higashitani, Cupertino, CA (US); Hao Fang, Shanghai (CN); Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/319,260

(22) Filed: Dec. 27, 2005

(65) Prior Publication Data

US 2007/0147118 A1 Jun. 28, 2007

(51) Int. Cl.
*G11C 16/00* (2006.01)

(52) U.S. Cl. .................... 365/185.18; 365/185.17; 365/185.02

(58) Field of Classification Search ........... 365/185.18, 365/185.17, 185.02
See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra et al. | |
| 5,570,315 A | 10/1996 | Tanaka et al. | |
| 5,677,873 A | 10/1997 | Choi et al. | |
| 5,715,194 A | 2/1998 | Hu | |
| 5,774,397 A | 6/1998 | Endoh et al. | |
| 5,793,677 A | 8/1998 | Hu et al. | |
| 5,887,145 A | 3/1999 | Harari et al. | |
| 5,969,985 A | 10/1999 | Tanaka et al. | |
| 5,991,202 A | 11/1999 | Derhacobian et al. | |
| 6,044,013 A | 3/2000 | Tanaka et al. | |
| 6,044,017 A * | 3/2000 | Lee et al. | 365/185.18 |
| 6,046,935 A | 4/2000 | Takeuchi et al. | |
| 6,061,270 A | 5/2000 | Choi | |
| 6,107,658 A | 8/2000 | Itoh et al. | |
| 6,154,391 A | 11/2000 | Takeuchi et al. | |
| 6,222,769 B1 * | 4/2001 | Maruyama et al. | 365/185.17 |
| 6,282,117 B1 | 8/2001 | Tanaka et al. | |
| 6,295,227 B1 | 9/2001 | Sakui et al. | 365/185.17 |
| 6,363,010 B2 | 3/2002 | Tanaka et al. | |

(Continued)

FOREIGN PATENT DOCUMENTS

EP   0 701 259 A2   3/1996

OTHER PUBLICATIONS

Aritome et al., "Reliability Issues of Flash Memory Cells", Proceedings of the IEEE, New York, vol. 81, No. 5, May 1, 1993, pp. 776-788.

(Continued)

*Primary Examiner*—Tan T. Nguyen
(74) *Attorney, Agent, or Firm*—Winston & Strawn LLP

(57) ABSTRACT

A NAND flash memory device incorporates a unique booster plate design. The booster plate is biased during read and program operations and the coupling to the floating gates in many cases reduces the voltage levels necessary to program and read the charge stored in the gates. The booster plate also shields against unwanted coupling between floating gates. Self boosting, local self boosting, and erase area self boosting modes used with the unique booster plate further improve read/write reliability and accuracy. A more compact and reliable memory device can hence be realized according to the present invention.

11 Claims, 8 Drawing Sheets

U.S. PATENT DOCUMENTS

| | | | |
|---|---|---|---|
| 6,455,889 B2 | 9/2002 | Sakui | 257/316 |
| 6,456,528 B1 | 9/2002 | Chen | |
| 6,493,265 B2 | 12/2002 | Satoh et al. | |
| 6,512,262 B2 | 1/2003 | Watanabe | 257/316 |
| 6,522,580 B2 | 2/2003 | Chen et al. | |
| 6,525,964 B2 | 2/2003 | Tanaka et al. | |
| 6,545,909 B2 | 4/2003 | Tanaka et al. | |
| 6,614,688 B2 | 9/2003 | Jeong et al. | |
| 6,717,838 B2 | 4/2004 | Hosoi | |
| 6,717,861 B2 | 4/2004 | Jeong et al. | |
| 6,840,106 B1 | 1/2005 | McNeil | 73/514 |
| 6,859,394 B2 | 2/2005 | Matsunaga et al. | |
| 6,859,395 B2 | 2/2005 | Matsunaga et al. | |
| 6,859,397 B2 | 2/2005 | Lutze et al. | |
| 6,898,126 B1 | 5/2005 | Yang et al. | |
| 6,930,921 B2 | 8/2005 | Matsunaga et al. | |
| 7,092,294 B2 * | 8/2006 | Sato et al. | 365/185.27 |
| 7,154,779 B2 * | 12/2006 | Mokhlesi et al. | 365/185.01 |
| 2001/0001491 A1 | 5/2001 | Sakui | 257/316 |
| 2001/0045585 A1 | 11/2001 | Watanabe | 257/296 |
| 2003/0147278 A1 | 8/2003 | Tanaka et al. | |
| 2005/0047210 A1 | 3/2005 | Matsunaga et al. | |
| 2005/0157549 A1 | 7/2005 | Mokhlesi et al. | 365/185.01 |
| 2005/0174852 A1 | 8/2005 | Hemink | |
| 2005/0226055 A1 | 10/2005 | Guterman | |
| 2006/0092703 A1 | 5/2006 | Chae et al. | |
| 2006/0133149 A1 | 6/2006 | Chae et al. | |
| 2007/0147119 A1 | 6/2007 | Pham et al. | 365/185.17 |
| 2007/0236992 A1 | 10/2007 | Oowada | 365/185.02 |
| 2007/0236993 A1 | 10/2007 | Oowada | 365/185.17 |

OTHER PUBLICATIONS

Choi et al., "A Novel Booster Plate Technology in High Density NAND Flash Memories for Voltage Scaling Down and Zero Program Disturbance", 1996 Symposium on VLSI Technology Digest of Technical Papers, 0-7803-3342-X/96/IEEE, 4 pages.

Jung et al., "A 3.3V 128Mb Multi-Level NAND Flash Memory for Mass Storage Applications", Samsung Electronics Co., Ltd., Kheung, Korea, 1 page.

Kim et al., "Fast Parallel Programming of Multi-Level NAND Flash Memory Cells Using the Booster-Line Technology", Symposium on VLSI Technology Digest of Technical Papers, 1997, 2 pages.

Notification of Transmittal of the International Search Report and the Written Opinion of the International Searching Authority, or the Declaration, issued in corresponding PCT/US2005/001962, mailed Aug. 16, 2005 15 pages.

Nozaki et al., "A 1-Mb EEPROM with MONOS Memory Cell for Semiconductor Disk Application", IEEE Journal of Solid-State Circuits, vol. 26, No. 4, Apr. 1991, 5 pages.

Suh et al., "A 3.3 V 32 Mb NAND Flash Memory with Incremental Step Pulse Programming Scheme", IEEE Journal of Solid-State Circuits, vol. 30, No. 11, Nov. 1995, 8 pages.

Brown et al., Editors, "Nonvolatile Semiconductor Memory Technology, A Comprehensive Guide to Understanding and Using NVSM Devices", IEEE Press Series on Microelectronic Systems, (1998), 57 pages.

Cho et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, 9 pages.

Jung et al., "A 3.3-V Single Power Supply 16-Mb Nonvolatile Virtual DRAM Using a NAND Flash Memory Technology", IEEE Journal of Solid-State Circuits, vol. 32, No. 11, Nov. 1997, 12 pages.

Jung et al., "A 117-$mm^2$ 3.3-V Only 128-Mb Multilevel NAND Flash Memory for Mass Storage Applications," IEEE Journal of Solid-State Circuits, vol. 31, No. 11, Nov. 1996, 10 pages.

Satoh et al., "A Novel Gate-Offset NAND Cell (GOC-NAND) Technology Suitable for High-Density and Low-Voltage Operation Flash Memories", IEDM Technical Digest, Dec. 1999, 6 pages.

ISA/EPO, Partial International Search Report, mailed in corresponding International Application No. PCT/US2006/005629 on Oct. 10, 2006, 4 pages.

ISA/EPO, Notification of Transmittal of the International Search Report and Written Opinion of the International Searching Authority, or the Declaration, mailed in corresponding International Application No. PCT/US2006/005629 on Jan. 24, 2007, 13 pages.

USPTO, Office Action mailed in related U.S. Appl. No. 11/319,908 (published as 2007/0147119 A1) on Feb. 6, 2007, 14 pages.

USPTO, Final Office Action, mailed in related U.S. Appl. No. 11/319,908 on Sep. 14, 2007, 10 pages.

USPTO, Non-Final Office Action, mailed in related U.S. Appl. No. 11/319,908 on Nov. 16, 2007, 9 pages.

* cited by examiner (Section A-A)

METHODS FOR ACTIVE BOOSTING TO MINIMIZE CAPACITIVE COUPLING EFFECT BETWEEN ADJACENT GATES OF FLASH MEMORY DEVICES

CROSS REFERENCE TO RELATED APPLICATIONS

The present invention is related to an application being filed concurrently herewith by Tuan D. Pham et al., entitled "Active Boosting to Minimize Capacitive Coupling Effect Between Adjacent Gates of Flash Memory Devices" which application is incorporated herein in its entirety by this reference and U.S. patent application Ser. No. 10/774,014 entitled "Self-Boosting System for Flash Memory Cells" to Hemink et al., which are hereby incorporated by this reference in their entirety, as are all patents and applications referred to in the present application.

FIELD OF THE INVENTION

This invention relates generally to non-volatile semiconductor memories of the flash EEPROM (Electrically Erasable and Programmable Read Only Memory) type, particularly to structures and methods of operating NAND types of memory cell arrays.

BACKGROUND OF THE INVENTION

There are many commercially successful non-volatile memory products being used today, particularly in the form of small form factor cards, which use an array of flash EEPROM cells.

One popular flash EEPROM architecture utilizes a NAND array, wherein a large number of strings of memory cells are connected through one or more select transistors between individual bit lines ("BLs") and a reference potential. NAND arrays are well known in the art and are widely utilized in various consumer devices at this time. A portion of such an array is shown in plan view in FIG. 2A. BL0–BL4 (of which BL1–BL3 are also labeled 12–16) represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0–WL3 (labeled P2 in FIG. 2B, a cross-sectional along line A—A of FIG. 2A) and string selection lines SGD and SGS extend across multiple strings over rows of floating gates, often in polysilicon (labeled P1 in FIG. 2B). However, for transistors 40 and 50, the control gate and floating gate may be electrically connected (not shown). The control gate lines are typically formed over the floating gates as a self-aligned stack, and are capacitively coupled with each other through an intermediate dielectric layer 19, as shown in FIG. 2B. The top and bottom of the string connect to the bit line and a common source line respectively, commonly through a transistor using the floating gate material (P1) as its active gate electrically driven from the periphery. This capacitive coupling between the floating gate and the control gate allows the voltage of the floating gate to be raised by increasing the voltage on the control gate coupled thereto. An individual cell within a column is read and verified during programming by causing the remaining cells in the string to be turned on by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel.

Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935, 6,456,528 and 6,522,580.

The charge storage elements of current flash EEPROM arrays are most commonly electrically conductive floating gates, typically formed from doped polysilicon material. However, other materials with charge storing capabilities, that are not necessarily electrically conductive, can be used as well. An example of such an alternative material is silicon nitride. Such a cell is described in an article by Takaaki Nozaki et al., "A 1-Mb EEPROM with MONOS Memory Cell for Semiconductor Disk Application" IEEE Journal of Solid-State Circuits, Vol. 26, No. 4, April 1991, pp. 497–501.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, a page defined as the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 byes of user data, following a standard established with magnetic disk drives, plus some number of bytes of overhead information about the user data and/or the block in which it is stored.

As in most all integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell charge storage element. This is accomplished by dividing the allowable voltage or charge storage window of a charge storage element into more than two states. The use of four such states allows each cell to store two bits of data, eight states stores three bits of data per cell, and so on. Operation of a multiple state flash EEPROM structure is described in U.S. Pat. Nos. 5,043,940; 5,172,338, 5,570,315 and 6,046,935.

A typical architecture for a flash memory system using a NAND structure will include NAND arrays, where each array includes several NAND strings. For example, FIG. 3A shows only three NAND strings 11, 13 and 15 of the memory array of FIG. 2A, which array contains more than three NAND strings. Each of the NAND strings of FIG. 3A includes two select transistors and four memory cells. For example, NAND string 11 includes select transistors 20 and 30, and memory cells 22, 24, 26 and 28. NAND string 13 includes select transistors 40 and 50, and memory cells 42, 44, 46 and 48. Each string is connected to the source line by its select transistor (e.g. select transistor 30 and select transistor 50). A selection line SGS is used to control the source side select gates. The various NAND strings are connected to respective bit lines by select transistors 20, 40, etc., which are controlled by select line SGD. In other embodiments, the select lines do not necessarily need to be in common. Word line WL3 is connected to the control gates for memory cell 22 and memory cell 42. Word line WL2 is connected to the control gates for memory cell 24 and memory cell 44. Word line WL1 is connected to the control gates for memory cell 26 and memory cell 46. Word line WL0 is connected to the control gates for memory cell 28 and memory cell 48. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 24, 44, and 64.

FIG. 3B is a circuit diagram depicting a number of NAND arrays, with each array controlled by a set of common word lines. The array of FIGS. 2A and 3 appears as the top array in FIG. 3B. As shown in FIG. 3B, each NAND string (e.g. 11, 13) in the same array is connected to one of a plurality of bit lines 12, 14, . . . and to a common source line, and are controlled by a common set of word lines (WL0–WL3).

Each memory cell can store data (analog or digital). When storing one bit of digital data (binary memory cell), the range of possible threshold voltages of the memory cell is divided into two ranges which are assigned logical data "1" and "0". In one example of a NAND type flash memory, the voltage threshold is negative after the memory cell is erased, and defined as logic "1." The threshold voltage after a program operation is positive and defined as logic "0." When the threshold voltage is negative and a read is attempted with 0 volt applied to its control gate, the memory cell will conduct current to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges, each range assigned to one data value. Memories storing data by differentiation between multiple (i.e. more than two) ranges of threshold voltage are known as multiple state memories. In one example of a NAND type memory, the threshold voltage after an erase operation is negative and defined as "11". Positive threshold voltages are used for the states of "10", "01", and "00."

When programming a NAND flash memory cell, a program voltage is applied to the control gate and the channel area of the NAND string that is selected for programming is grounded (0V). Electrons from the channel area under the NAND string are injected into the floating gate. When electrons accumulate in the floating gate, the floating gate becomes negatively charged and the threshold voltage of the cell is raised. To ground the channel area of the selected NAND string, the corresponding bitline is grounded (0 volt), while the SGD is connected to a sufficiently high voltage (typically $V_{dd}$ at for example 3.3 volts) that is higher than the threshold voltage of the select transistors. To apply the program voltage to the control gate of the cell being programmed, that program voltage is applied on the appropriate word line. As discussed above, that word line is also connected to one cell in each of the other NAND strings that utilize the same word line. For example, when programming cell 24 of FIG. 3A, the program voltage will also be applied to the control gate of cell 44 because both cells share the same word line. A problem arises when it is desired to program one cell on a word line without programming other cells connected to the same word line, for example, when it is desired to program cell 24 and not cell 44. Because the program voltage is applied to all cells connected to a word line, an unselected cell (a cell that is not to be programmed) on the word line may become inadvertently programmed. For example, cell 44 is adjacent to cell 24. When programming cell 24, there is a concern that cell 44 might unintentionally be programmed. The unintentional programming of the unselected cell on the selected word line is referred to as "program disturb." More generally speaking, "program disturb" is used to describe any unwanted threshold voltage shift, either in the positive or negative direction, which can occur during a programming operation and is not necessarily limited to the selected word line.

Several techniques can be employed to prevent program disturb. One method known as "self boosting" ("SB") is proposed by K. D. Suh et al. in "A 3.3 V 32 Mb NAND Flash Memory with Incremental Step Pulse Programming Scheme," Journal of Solid-State Circuits, Vol 30, No. 11, November 1995, pp. 1149–55. During programming using the SB scheme, the channel areas of the unselected NAND strings are electrically isolated from their corresponding bit lines. Subsequently an intermediate pass voltage (e.g. 10 volts) is applied to the unselected word lines while a high program voltage (e.g. 18 volts) is applied to the selected word line. The channel areas of the unselected NAND strings are capacitively coupled to the unselected word lines, causing a voltage (e.g. six volts, assuming a coupling ratio of 0.6) to exist in the channel areas of the unselected NAND strings. This so called "Self Boosting" reduces the potential difference between the channel areas of the unselected NAND strings and the program voltage that is applied to the selected word line. As a result, for the memory cells in the unselected NAND strings and especially for the memory cells in such strings on the selected word line, the voltage across the tunnel oxide and hence the program disturb are significantly reduced. For more information regarding NAND arrays and boosting, please refer to U.S. patent application Ser. No. 10/774,014 to Gertjan Hemink, which is hereby incorporated by reference in its entirety.

A NAND string is typically (but not always) programmed from the source side to the drain side, for example, from memory cell 28 to memory cell 22. When the programming process is ready to program the last (or near the last) memory cell of the NAND string, if all or most of the previously programmed cells on the string being inhibited (e.g. string 13) were programmed, then there is negative charge in the floating gates of the previously programmed cells. Because of this negative charge on the floating gates, the pre-charging can not take place completely, resulting in a lower initial potential of the channel area under the NAND string and the subsequent self-boosting of such channel area becomes less effective as well. Therefore, the boosted potential in the channels of the unselected NAND strings may not become high enough and there still may be program disturb on the last few word lines. For example, when programming voltage is applied to WL3, if cells 48, 46, and 44 on a string that is inhibited were programmed, then each of those memory cells 44, 46, 48 has a negative charge on its floating gate which will limit the boosting level of the self boosting process and possibly cause program disturb on cell 42.

In view of the above problem, as an improvement, T. S. Jung et al. proposed a local self boosting ("LSB") technique in "A 3.3V 128 Mb Multi-Level NAND Flash Memory for Mass Storage Applications", ISSCC96, Session 2, Flash Memory, Paper TP 2.1, IEEE, pp. 32.

In the LSB scheme, when applying a high programming voltage to the word line WL2, in order to reduce or prevent program disturb in regard to memory cell 44 on a string that is inhibited, 0 volts are applied to word lines WL1 and WL3 so that memory cells 42 and 46 are turned off. Then the channel potential in memory cell 44 is not or at least less influenced by the self boosting in the channel regions of memory cells 42, 46, and 48. Therefore, the channel potential of the channel region of memory cell 44 may be self boosted by the high programming voltage Vpgm to a voltage level that is higher than that achieved when the channel region of memory cell 44 is influenced by the self boosting in the remaining memory cells 42, 46, and 48. This prevents program disturb when memory cell 24 is being programmed. For a more detailed explanation of self boosting and local self boosting, please see U.S. Pat. No. 6,107,658, especially the description in columns 6–10.

Another technique proposed as an alternative to local self boosting is described in U.S. Pat. No. 6,525,964 to Tanaka et al. and is known as erased area self boosting ("EASB"). EASB differs from LSB in that, instead of turning off both memory cells on either side of the unselected cell to prevent program disturb of the cell as in LSB, EASB turns off only the memory cell on the source side of the unselected cell. For example, where memory cell 24 is being programmed, only memory cell 46 is being turned off without turning off memory cell 42, in order to prevent program disturb at cell 44.

While LSB and EASB maybe advantageous for many applications, certain problems are still encountered when these schemes are used in their current form, especially when the memory cell dimensions of future generation devices are continually reduced or scaled down. It is therefore desirable to provide improved boosting structures and schemes.

SUMMARY OF THE INVENTION

A NAND memory device made according to the present invention is less subject to errors in programming and reading, and can also be made more compact at the same time. A booster plate with fingers than run between but not above the wordlines provides coupling that is advantageous to operations without producing excessive coupling to the top of the wordlines, which can be detrimental to operations. Elimination of unwanted coupling between adjacent cells minimizes undesired shifts above or below voltage thresholds. This is especially important in multi-level applications where the levels are closely spaced. The processes used in making the booster plate and the device in which it is used are also described.

When combined with unique boosting methods, the combination of the plate and the methods minimizes the noise that might otherwise be present, and allows for lesser voltage levels to be utilized, when appropriate. This minimizes disturbs. These methods include self boost modes, local self boost modes, and erase area self boost modes.

DESCRIPTION

The boosting structure and routines utilized in the present invention, generally speaking, make it possible to scale down a memory array or structure, and also result in more reliable reading and writing of data within such a structure. The structure provides increased capacitive coupling where needed, while at the same time avoids the consequence of having an increased capacitive coupling where it is detrimental to operations. In particular, as compared to a prior solution incorporating a booster plate, control gate (wordline) capacitance is reduced by nearly 80%, which reduces the wordline to wordline coupling and the unwanted noise associated with it. As compared to prior solutions without a booster plate, floating gate to floating gate coupling in the wordline direction is virtually eliminated.

Figure 1:
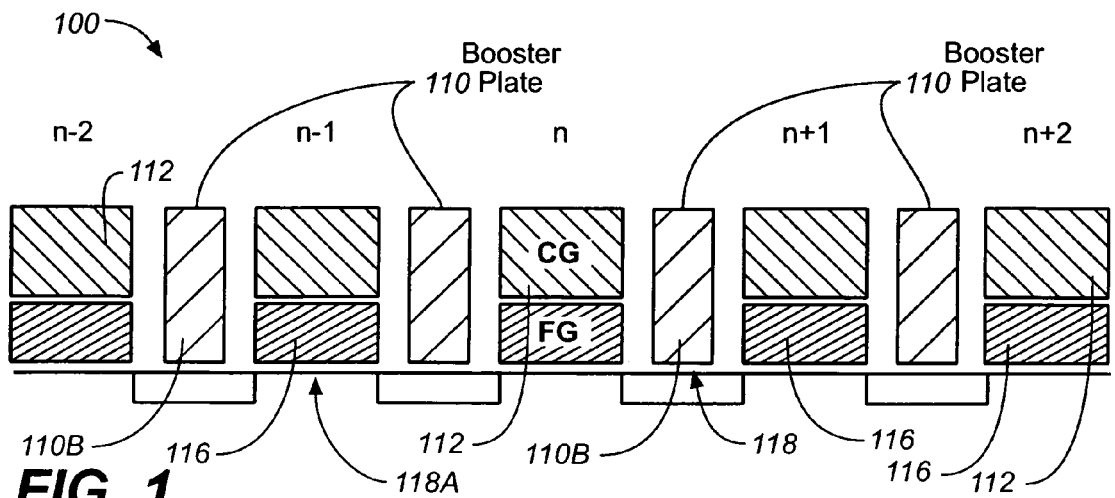
FIG. 1 is a cross section of device 100, an embodiment of the present invention.
Figure 2A:
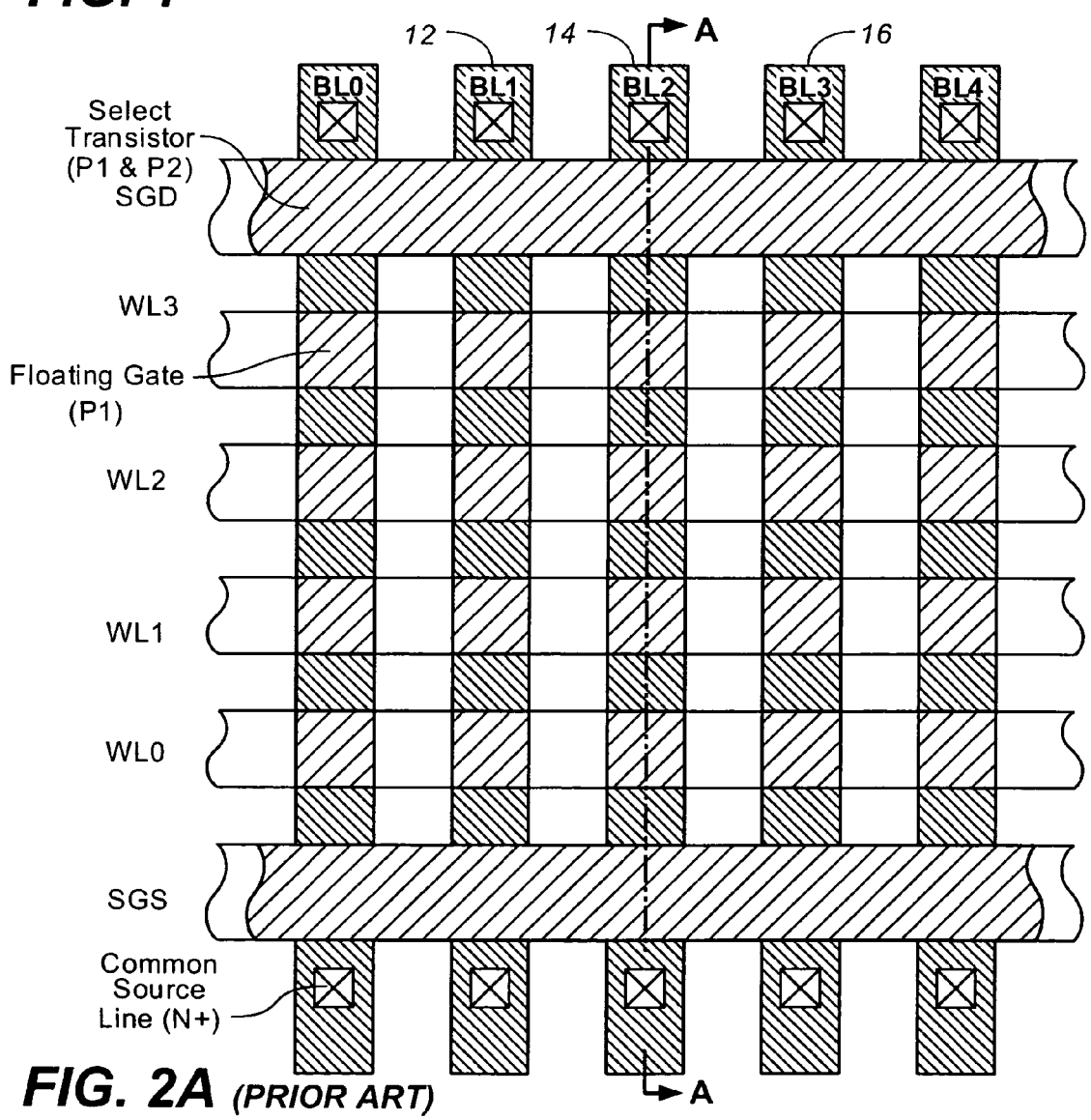
FIG. 2A is a plan view of a prior art memory array or device presented to provide background on how NAND flash memory devices operate.
Figure 2B:
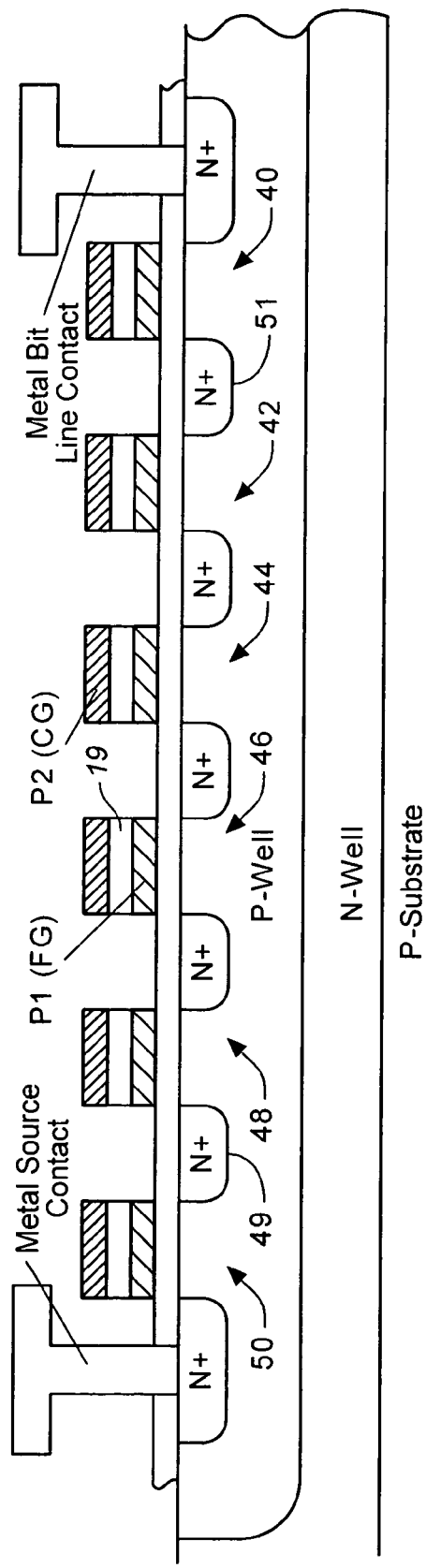
FIG. 2B is a cross section of the prior art memory array shown in FIG. 2A.
Figure 3A:
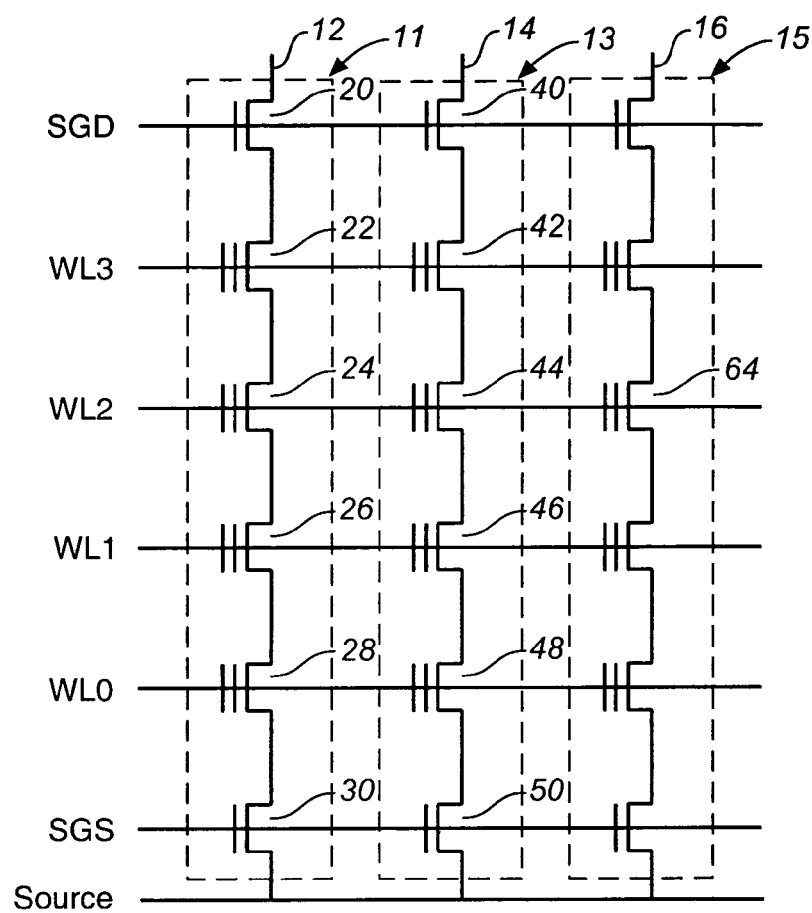
FIG. 3A is an electrical schematic of the array seen in FIGS. 2A and 2B.
Figure 3B:
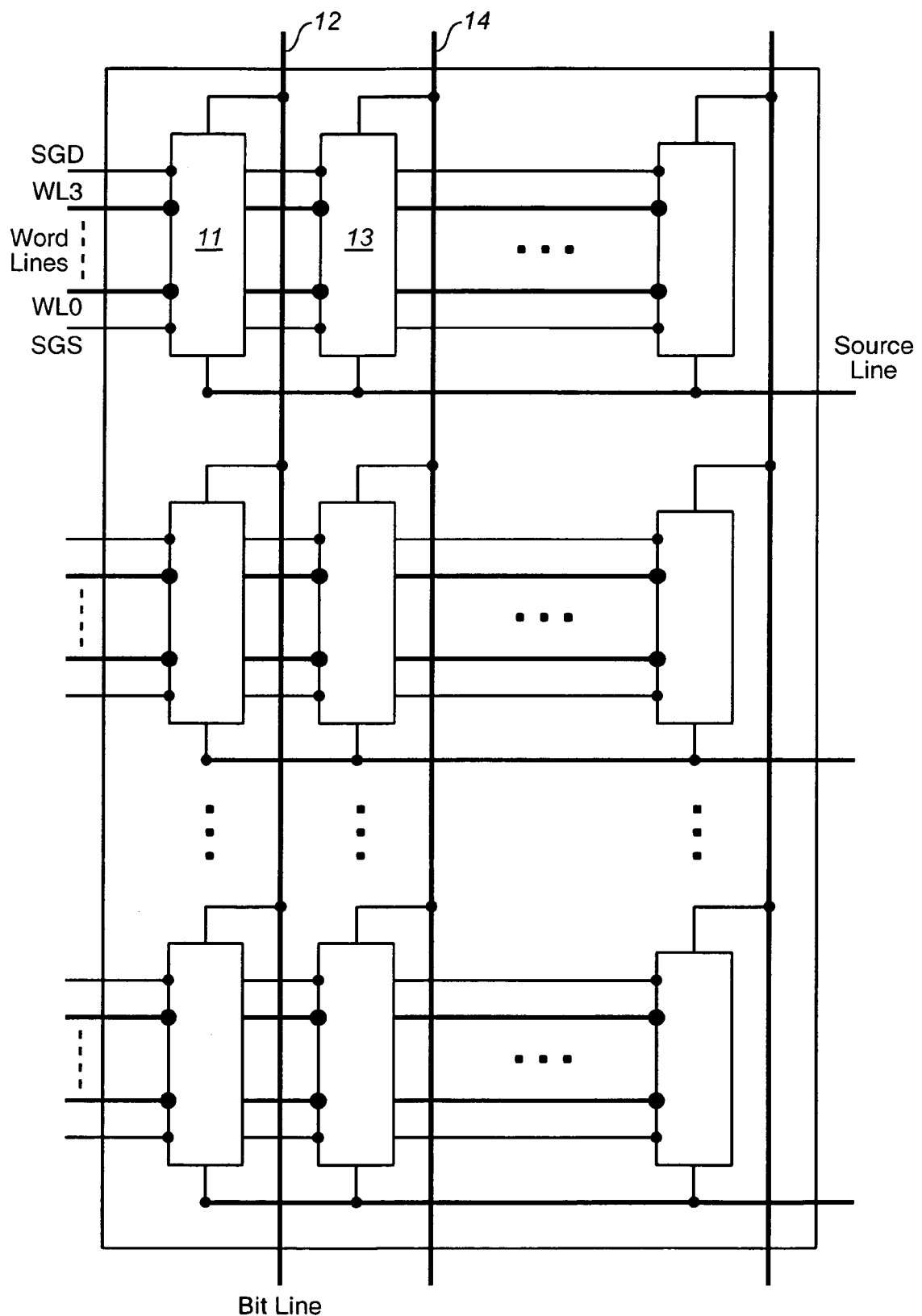
FIG. 3B is a circuit diagram depicting a number of NAND arrays such the one seen in FIGS. 2A and 2B, with each array controlled by a set of common word lines.

FIG. 1 illustrates a cross section of memory structure or device 100, an embodiment of the present invention. The cross section is taken perpendicular to the direction or axes of the wordlines, and would be parallel to section A—A discussed with regard to the prior art described and shown in FIG. 2A. A number of control gates 112, also known as wordlines are illustrated in this cross section. The center wordline is referenced as the "nth" wordline and the position of the other wordlines is noted in relation to the referenced wordline. Generally, when the programming operations will be discussed later, the "nth" wordline will denote the selected wordline for a given operation.

Figure 4A:
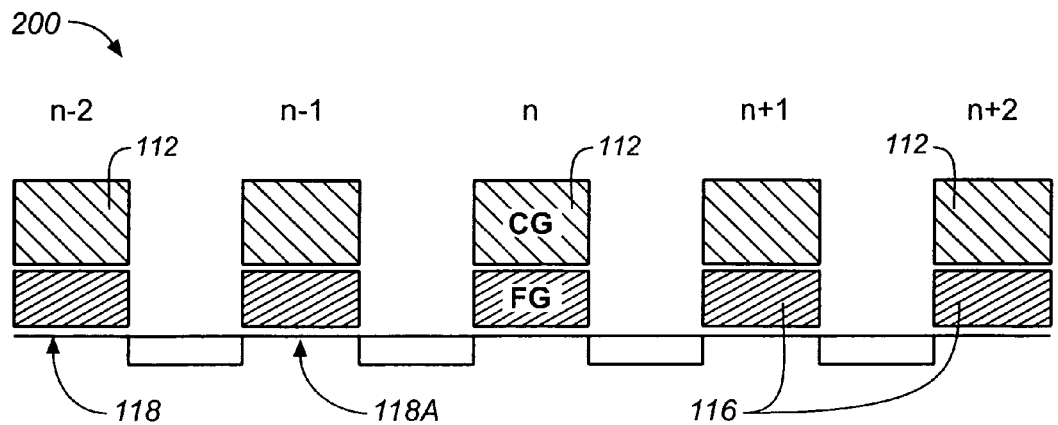
FIG. 4A is a cross section of prior art device 200.
Figure 6A:
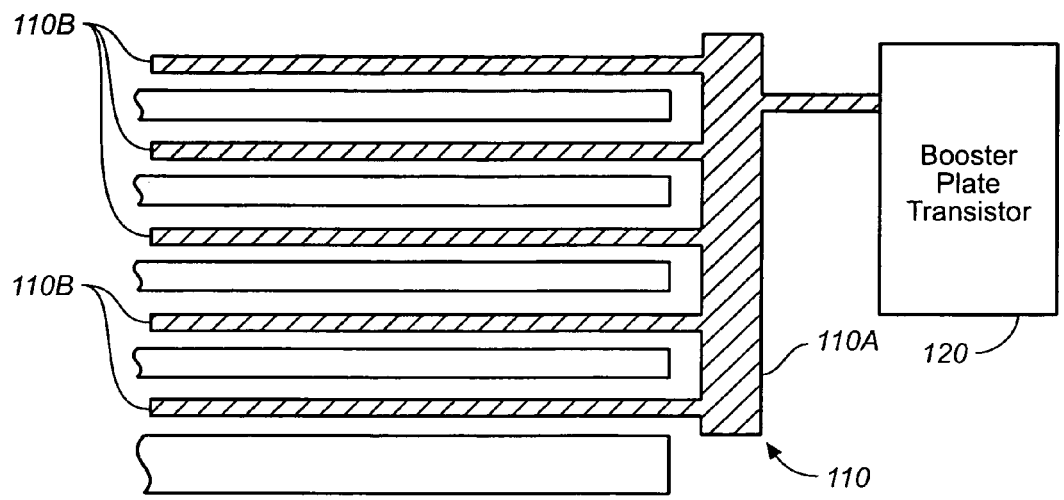
FIGS. 6A and 6B illustrate different embodiments of booster plate 110.
Figure 6B:
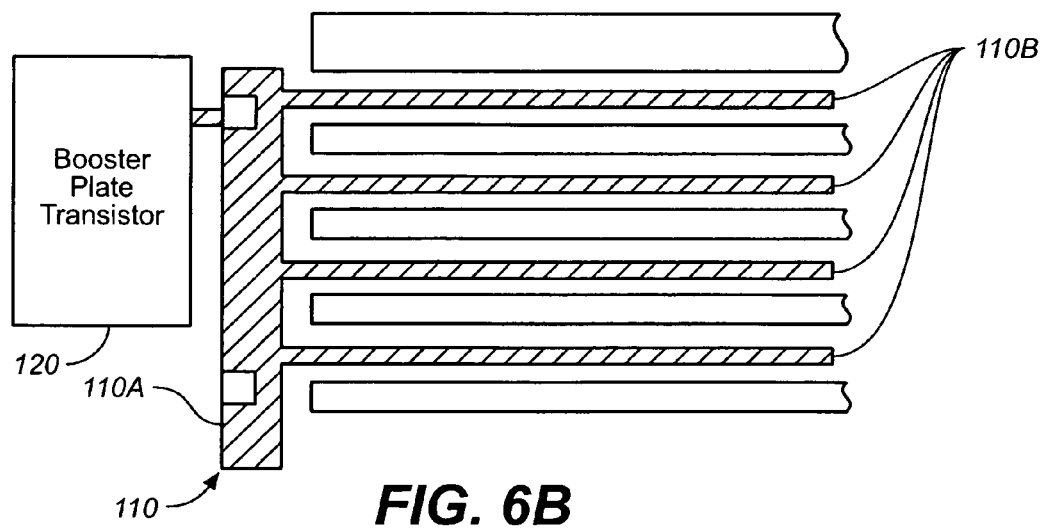

As can be seen in FIG. 1, the wordlines 112 are above floating gates 116. The fingers 110B of booster plate 110 are located in between the wordlines and floating gates. The booster plate fingers 110B extend from the bottom of the floating gates to the top of the wordlines. The fingers do not extend past the level of the top of the wordlines 112 in FIG. 1. In other words, no portion of the booster plate 110 or fingers 110B is located over or on top of the upper surface of the wordlines. In this or other embodiments, the fingers may have an upper surface that is higher than an upper surface of the wordlines when measured a from fixed point of reference such as the substrate or a layer upon the substrate. However, this should not be taken to mean that the booster plate and fingers are located above or over the wordlines. The bottom of the booster plate 110 is at the same level as the bottom of the floating gates 110. This can be at the top level 118A of substrate 118, although often there may be one more other layers between the bottom of the floating gates 110 and the top of the substrate 118. The layers may also be present between the bottom of the booster plate 110 and the top of the substrate 118. This cross section is taken in the middle of the array, in a location where the fingers 110B are not connected. Although it cannot be seen in this cross section, the fingers of the booster plate are all tied to a linking portion of the booster plate at the periphery of the device, as can be seen in FIGS. 6A and 6B. The linking portion can be thought of as type of electrical bus. That is to say, the entire booster plate 110 is conductive, and a voltage applied to the linking portion will be distributed to each of the fingers 110B. FIG. 4A illustrates a cross section of prior device 200, which is similar to device 100 but lacks the booster plate. Fingers 110B of the booster plate 110 result in a near elimination of the floating gate to floating gate coupling present in the prior device 200. This minimizes disturbs and allows the usage of lower voltage levels in various operations, which further allows for scaling down of the device.

Figure 4B:
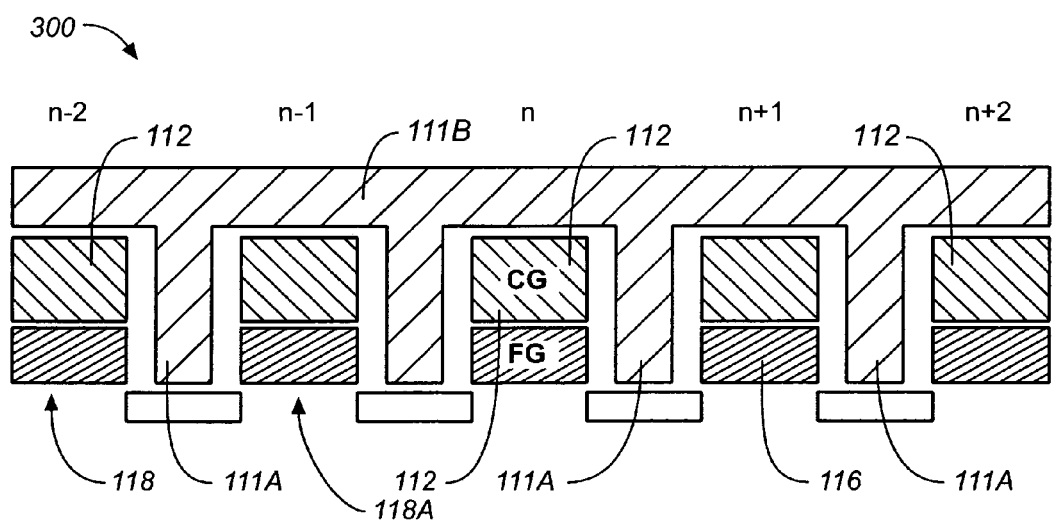
FIG. 4B is a cross section of prior art device 300.

Because the booster plate 110 in device 100 does not extend above the wordlines, there will be limited if any coupling to the top portion of the wordlines. This is in contrast to the prior art device 300 shown in FIG. 4B. In FIG. 4B, the portion of device 300 illustrated in this cross section is structurally similar to that shown in FIG. 1 with the exception of the booster plate. Booster plate 111 of device 300 has a solid upper plate portion 111B present above the top surface of wordlines 112. Essentially, the booster plate 111 in device 300 covers the wordlines and floating gates of the memory array like a (continuous) blanket. This provides a high level of coupling between plate 111 and the control gates 112 and floating gates 116. However, as will be discussed later, such a high degree of coupling is not advantageous because it dramatically increases the overall wordline or control gate capacitance. As can be seen in Table M.2, the total control gate capacitance in device 300 is 78% higher than that of device 200 and 42% higher than in device 100 embodying the present invention. Control gate ("CG") coupling presents noise problems in read and write operations and is therefore undesirable. This is especially a problem in multi-level memories, where the degree for error is quite low, and getting lower everyday. Furthermore, minimizing the noise and interference from excessive control gate coupling is key in reducing the scale and increasing the capacity of these flash devices.

Table M.1 below shows the relative floating gate ("FG") capacitance values for device 100 of the present invention versus prior art devices 200 and 300. As can be seen, the FG—FG coupling and FG-CG coupling is reduced to zero percent in the wordline direction. The FG—FG coupling is also slightly reduced in the bitline ("BL") direction due to the increased overall capacitance.

TABLE M.1

| | | FG capacitance | | | |
|---|---|---|---|---|---|
| | | 200 | 300 | 100 | |
| FGn – CGn | Ccg | 50.0% | 50.0% | 50.0% | |
| FGn – CGn + 1 | | 2.0% | 0.0% | 0.0% | |
| FGn – CGn – 1 | | 2.0% | 0.0% | 0.0% | |
| FGn – FGn – 1 | | 4.0% | 0.0% | 0.0% | |
| FGn – FGn + 1 | | 4.0% | 0.0% | 0.0% | |
| FGn – CHANNELn | Cch | 34.0% | 34.0% | 34.0% | |
| FGn – S/D | | 2.0% | 0.0% | 0.0% | (BL direction) |
| FGn – FGm | | 2.0% | 2.0% | 2.0% | |
| FGn – Booster | Csp | 0.0% | 30.0% | 30.0% | |
| Total | Cfgtotal | 100.0% | 116.0% | 116.0% | |

Table M.2 below illustrates the CG capacitance values for device 100 of the present invention versus prior art devices 200 and 300. As can be seen in Table M.2, the total control gate capacitance in device 300 is 78% higher than that of device 200 and 42% higher than in device 100 embodying the present invention. As mentioned above, this dramatic increase in capacitance presents noise problems in read and write operations and is therefore undesirable.

TABLE M.2

| | CG Capacitance | | |
|---|---|---|---|
| | 200 | 300 | 100 |
| CGn – FGn | 52.0% | 52.0% | 52.0% |
| CGn – FGn + 1 | 2.5% | 0.0% | 0.0% |
| CGn – FGn – 1 | 2.5% | 0.0% | 0.0% |
| CGn – CGn – 1 | 21.0% | 0.0% | 0.0% |
| CGn – CGn + 1 | 21.0% | 0.0% | 0.0% |
| CGn – S/D | 1.0% | 0.0% | 0.0% |
| CGn – Booster | 0.0% | 126.0% | 84.0% |
| Total | 100.0% | 178.0% | 136.0% |

Read Operations

In order to help in understanding the operation and advantages of the present invention, some examples of voltages used in read operations are shown in the tables below. It should be understood that these are only illustrative examples or embodiments and other values can of course be used with the present invention. Vplate is the voltage applied to booster plate 110.

| During Read Operation: | |
|---|---|
| Case 1: | |
| WL0 | Vread |
| WL1 | Vread |
| WLn – 2 | Vread |
| WLn – 1 | Vread |
| Sel WLn | 0 V |
| WLn + 1 | Vread |
| WLn + 2 | Vread |
| WL30 | Vread |
| WL31 | Vread |
| Vplate | Vread |
| Case 2: | |
| WL0 | Vread |
| WL1 | Vread |
| WLn – 2 | Vread |
| WLn – 1 | Vread |
| Sel WLn | 0 V |
| WLn + 1 | Vread |
| WLn + 2 | Vread |
| WL30 | Vread |
| WL31 | Vread |
| Vplate | Vread + Beta |

In case 2, Beta is preferably about 0.5 volts. The operation of case 2 minimizes read disturb issues because when the Vplate potential is increased by Beta, the Vpass value on the unselected WLs can be reduced to a level that eliminates or at least minimizes the Vread disturb effect for the unselected WLs. This reduction is possible because of the capacitive coupling effect between the fingers of the booster plate and memory cell-floating gates.

Program Operations

The memory cells of device 100 can be programmed in many different ways. Booster plate 110 can be biased at different voltage levels for different cells or floating gates during operations, e.g. for a program operation. And of course, the voltage level of a selected wordline (and associated selected floating gate(s)) and unselected wordlines can also be varied. Use of the booster plate 110, with its fingers 110B that don't rise above the upper level or surface of the wordlines, allows for more precise and effective boosting control than in prior devices, for example, device 300.

A self boost ("SB") mode, local self boost ("LSB") mode, and erase area self boost ("EASB") mode will now be described. Other variations and modes may also be used with the structure of the present invention. Currently, the SB and EASB modes are preferable for use within device 100.

Self Boost Mode

Examples of the Vplate bias potential during the SB mode are shown below for two different cases or scenarios.

TABLE SB1

| During Programming Operations: SB Mode (Self Boost) Case 1: | |
|---|---|
| WL0 | Vpass |
| WL1 | Vpass |
| WLn − 2 | Vpass |
| WLn − 1 | Vpass |
| Sel WLn | VPGM |
| WLn + 1 | Vpass |
| WLn + 2 | Vpass |
| WL30 | Vpass |
| WL31 | Vpass |
| Vplate | Vpass~8 v |

Biasing the booster plate 110 with the Vpass voltage level provides a very high self boosting potential.

TABLE SB2

| SB Mode (Self Boost) Case 2: | |
|---|---|
| WL0 | Vpass |
| WL1 | Vpass |
| WLn − 2 | Vpass |
| WLn − 1 | Vpass |
| Sel WLn | VPGM |
| WLn + 1 | Vpass |
| WLn + 2 | Vpass |
| WL30 | Vpass |
| WL31 | Vpass |
| Vplate | Vpass + Alpha |

Although biasing the booster plate with the Vpass voltage level provides good self boosting, in order to minimize the disturb that may result from the Vpass voltage applied to unselected wordlines, it is desirable to minimize the Vpass level. The level of Vpass can be reduced by increasing the voltage Vplate applied to the booster plate by some amount Alpha. This is due to the coupling between the booster plate and the cell floating gates. Preferably, Alpha is about 0.5 volts in the current embodiment, but it can range up to several volts. Alpha will be selected based upon the particular structure of the device in order to minimize or eliminate the Vpass disturb effect.

As can be seen in the following tables, in comparison with prior device 200, both self boosting cases allow for the program voltage Vpgm to be reduced while still applying the same voltage to the floating gate (e.g. 10v). As mentioned previously, this is beneficial for reducing disturbs and other unwanted coupling effects.

TABLE SB3

| | | Program Operation SB mode | | |
|---|---|---|---|---|
| | | 100 | | |
| | 200 | case 1 | case 2 | |
| SGD | VDD | VDD | VDD | VDD: ~2 v |
| SGS | 0 v | VSG | VSG | VPGM1: ~20 v |
| Selected WL | VPGM1 | VPGM2 | VPGM3 | VPASS1: ~8 v |
| Unselected WL | VPASS1 | VPASS2 | VPASS3 | VPGM2: ~16.7 v |
| | | | | VPASS2: ~8 v |
| Selected BL | 0 v | 0 v | 0 v | VPGM3: ~16.3 v |
| Unselected BL | VDD | VDD | VDD | VPASS3: ~8 v |
| Source | ~1 v | ~1 v | ~1 v | a: ~0.5 v |
| Pwell | 0 v | 0 v | 0 v | (VPGM2 < VPGM1) |
| Booster Plate | N.A | VPASS2 | VPASS3 + a | (VPGM3 < VPGM2) |

TABLE SB4

| | |
|---|---|
| 200 | Selected Cell FG voltage = VPGM1 × Ccg/Cfgtotal<br>20 v × 0.5 = 10 v |
| 100 case1 | Selected Cell FG voltage = VPGM2 × Ccg/Cfgtotal + VPASS2 × Csp/Cfgtotal<br>16.7 v × (0.5/1.16) + 8 × (0.3/1.16) = 10 v |
| 100 case2 | Selected Cell FG voltage = VPGM3 × Ccg/Cfgtotal + (VPASS3 + a) × Csp/Cfgtotal<br>16.3 v × (0.5/1.16) + (8 + 0.5) × (0.3/1.16) = 10 v |

Local Self Boost Mode

While the SB mode and EASB mode are preferred, the LSB mode can also be implemented in or used with device 100. In the LSB mode a positive voltage is not applied to the booster plate in order to isolate the selected cell from other cells.

TABLE LSB 1

| LSB Mode (Local Self Boost): | |
|---|---|
| WL0 | Vpass |
| WL1 | Vpass |
| WLn − 2 | Vpass |
| WLn − 1 | 0 V |
| Sel WLn | VPGM |
| WLn + 1 | 0 V |
| WLn + 2 | Vpass |
| WL30 | Vpass |
| WL31 | Vpass |
| Vplate | 0 V |

Erase Area Self Boost Mode

In the EASB mode the booster plate voltage can vary depending on which wordline is being programmed. There is no limit to the possible variations of voltages applied on different wordlines and the booster plate, especially given that the number of cells in a given NAND string and the associated wordlines are prone to increase over time. However, some examples will be given for a cell having 32 wordlines. In one example, the Vpgm voltages applied at the various wordlines can linearly increase or decrease from the first wordline to the last wordline ("WL").

In another example, for lower WLs such as WL0 to WL3, while being programmed at Vpgm, the booster plate voltage Vplate can range up to the Vpass value. For middle WLs such as WL4 to WL27, while being programmed at Vpgm, the booster plate voltage Vplate is at or around the Vread value. For higher WLs such as WL28 to WL31, while being programmed at Vpgm, the booster plate voltage Vplate can be at or around the 0V value.

EASB Case 1

In EASB case 1, a voltage of approximately Vread is placed on the booster plate 110, as seen in the tables below. In comparison to the prior design 200 lacking the booster plate, the level of Vpgm is less. Again, this is advantageous in lessening disturbs and other unwanted coupling.

TABLE EASB 1.1

| | Program Operation EASB mode | |
|---|---|---|
| | 200 | 100 case 1 |
| SGD | VDD | VDD |
| SGS | 0 v | VSG |
| Unselected WL max | VPASS1 | VPASS2 |
| Unselected WLn + 2 | VPASS1 | VPASS2 |
| Unselected WL + 1 | VPASS1 | VPASS2 |
| Selected WLn | VPGM1 | VPGM2 |
| Unselected WLn − 1 | 0 v | 0 v |
| Unselected WLn − 2 | VPASS1 | VPASS2 |
| Unselected WL 0 | VPASS1 | VPASS2 |
| Selected BL | 0 v | 0 v |
| Unselected BL | VDD | VDD |
| Source | ~1 v | ~1 v |
| Pwell | 0 v | 0 v |
| Booster Plate | N.A. | VREAD2 |

VDD: ~2 v
VPGM1: ~20 v
VPASS1: ~8 v
VPGM2: ~19.2 v
VPASS2: ~8 v
VREAD2: ~5 v
(VPGM2 < VPGM1)

TABLE EASB 1.2

| 200 | Selected Cell FG voltage = VPGM1 × Ccg/Cfgtotal |
|---|---|
| | 20 v × 0.5 = 10 v |
| 100 | Selected Cell FG voltage = VPGM2 × Ccg/Cfgtotal + VPASS2 × Csp/Cfgtotal |
| | 19.2 v × (0.5/1.16) + 5 × (0.3/1.16) = 10 v |

EASB Case 2

Case 2 of the EASB mode improves upon EASB case 1 and is the preferred EASB mode. This is because lower program voltages can be used for many of the programming operations. While in some instances a higher program voltage is used, as compared to what would be used by device 200 without a booster plate, overall, the use of this EASB programming mode with the current booster plate 110 is desirable.

TABLE EASB 2.1

| | Program Operation EASB mode | | | |
|---|---|---|---|---|
| | 200 | 100 case 2 | | |
| | all WLs | WL0 | WLcenter | WLmax |
| SGD | VDD | VDD | VDD | VDD |
| SGS | 0 v | VSG | VSG | VSG |
| Unselected WL max | VPASS1 | VPASS2 | VPASS2 | VPASS2 |
| Unselected WLn + 2 | VPASS1 | VPASS2 | VPASS2 | VPASS2 |
| Unselected WLn + 1 | VPASS1 | VPASS2 | VPASS2 | VPASS2 |
| Selected WLn | VPGM1 | VPGM2_0 | VPGM2_cen | VPGM2_max |
| Unselected WLn − 1 | 0 v | 0 v | 0 v | 0 v |
| Unselected WLn − 2 | VPASS1 | VPASS2 | VPASS2 | VPASS2 |
| Unselected WL 0 | VPASS1 | VPASS2 | VPASS2 | VPASS2 |
| Selected BL | 0 v | 0 v | 0 v | 0 v |
| Unselected BL | VDD | VDD | VDD | VDD |
| Source | ~1 v | ~1 v | ~1 v | ~1 v |
| Pwell | 0 v | 0 v | 0 v | 0 v |
| Booster Plate | N.A. | VPASS2 | VREAD2 | 0 v |

TABLE EASB 2.2

VDD: ~2 v
VPGM1: ~20 v
VPASS1: ~8 v
VPGM2_0: ~16.7 v
VPGM2_cen: ~19.2 v
VPGM2_max: ~23.2 v
VPASS2: ~8 v
VREAD2: ~5 v

TABLE EASB 2.3

| 200 | Selected Cell FG voltage = VPGM1 × Ccg/Cfgtotal |
|---|---|
| | 20 v × 0.5 = 10 v |
| 100 case2 WL0 | Selected Cell FG voltage = VPGM2 × Ccg/Cfgtotal + VPASS2 × Csp/Cfgtotal |
| | 16.7 v × (0.5/1.16) + 8 × (0.3/1.16) = 10 v |
| 100 case2 WL_cen | Selected Cell FG voltage = VPGM2 × Ccg/Cfgtotal + VPASS2 × Csp/Cfgtotal |
| | 19.2 v × (0.5/1.16) + 5 × (0.3/1.16) = 10 v |
| 100 case2 WL_max | Selected Cell FG voltage = VPGM3 × Ccg/Cfgtotal + (VPASS3 + a) × Csp/Cfgtotal |
| | 23.2 v × (0.5/1.16) + 0 × (0.3/1.16) = 10 v |

Fabrication

Device 100 and other embodiments of the present invention can be made in a number of ways. One way to make such a device is described below, for illustrative purposes.

Figure 5A:
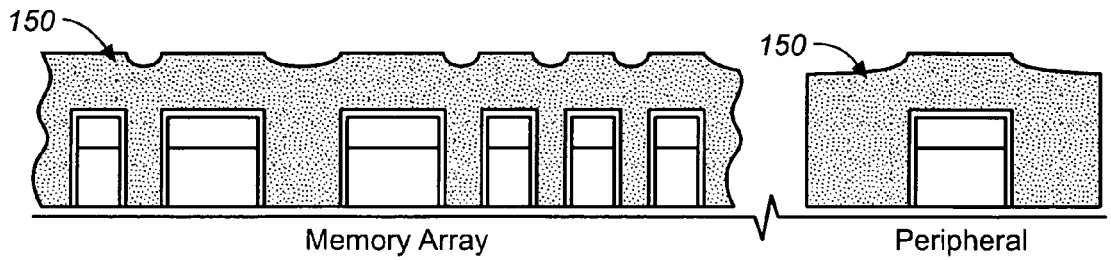
FIGS. 5A–5D illustrate device 100 at various stages during fabrication of the device.
Figure 5B:
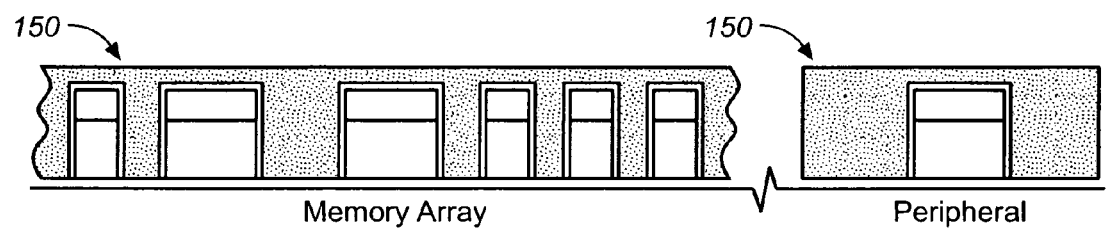

FIGS. 5A–5D illustrate device 100 at various stages during fabrication of the device. The standard NAND fabrication processes are used to make the memory array structure underlying the boron phosphorous silicon glass ("BPSG") layer 150 deposited upon the structure, as seen in FIG. 5A. After it is deposited, there are two options. In option 1, it is left unpolished. In option two, the BPSG layer undergoes chemical mechanical polishing ("CMP"). About 1000 angstroms of the layer are left over the gate structure after the CMP. The resultant structure is seen in FIG. 5B.

Figure 5C:
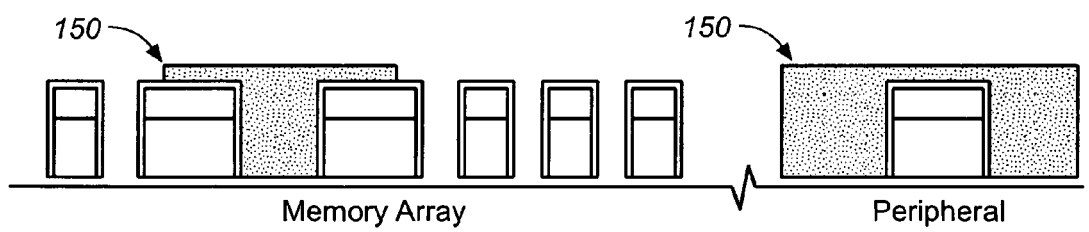
Figure 5D:
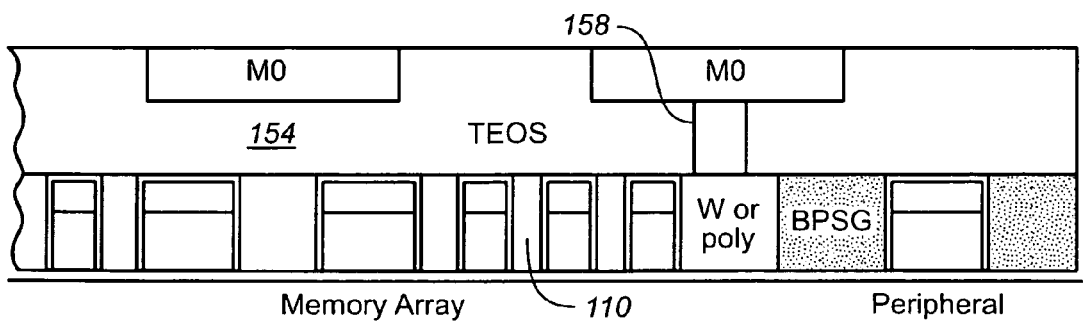

Next, a mask is applied before the BPSG layer 150 is etched for oxide removal. Once the mask is in place the oxide is etched. Any known etching method can be implemented but reactive ion etching or HF vapor etching are preferred. About 7000 angstroms of the BPSG will be removed, but full oxide islands will be kept in the SG areas, and full oxide will be left in the periphery to keep the periphery circuit intact. Then the photo resist of the mask will be removed and the structure cleaned, followed by a post barrier SiN oxidation step. The resultant structure is shown in FIG. 5C.

Figure 6C:
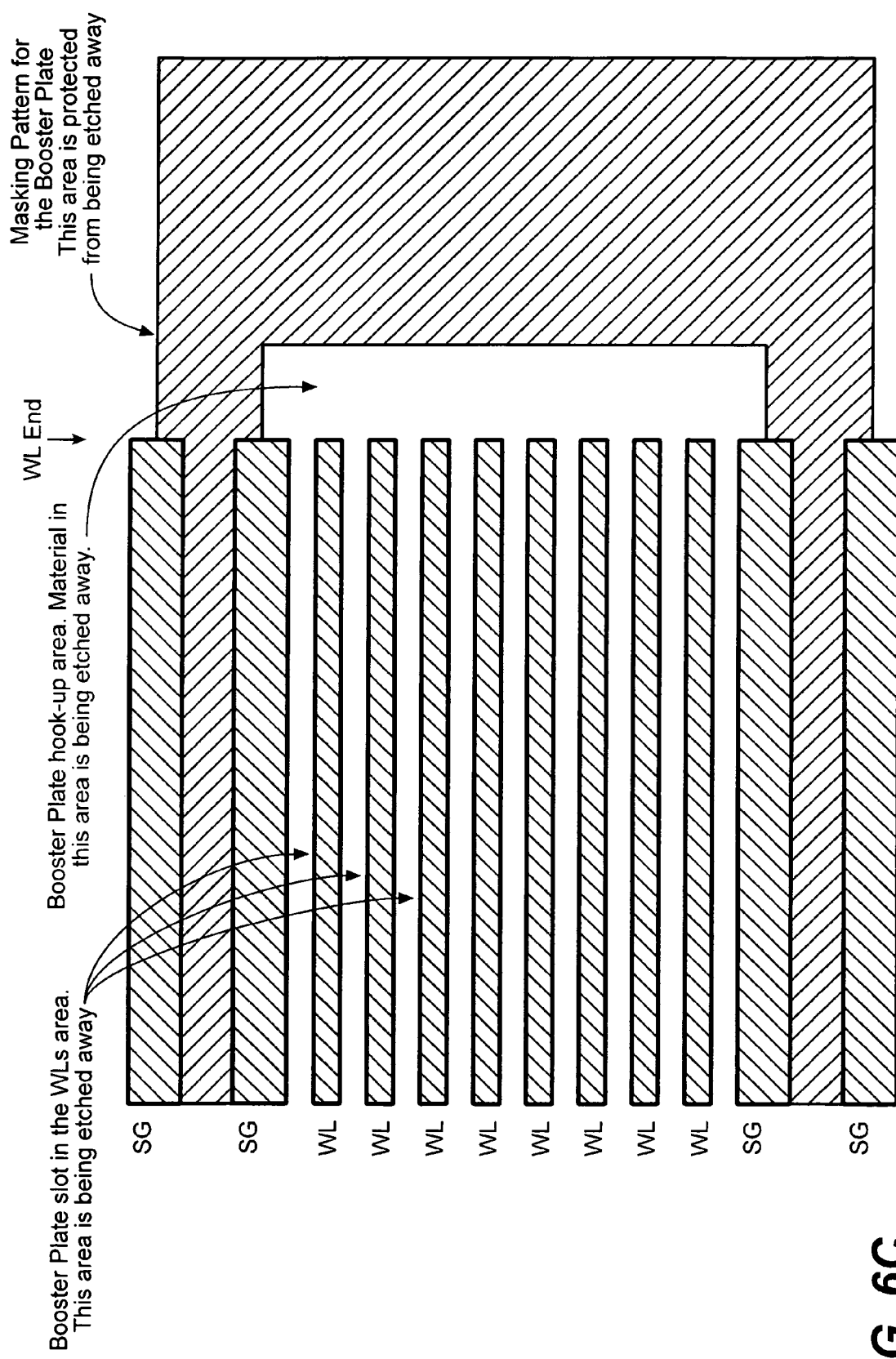
FIG. 6C illustrates a mask used in making booster plate 110.

Next, a mask with a pattern such as that seen in FIG. 6C is made upon the structure. An RIE or HF wet etch or equivalent is performed and the BPSG is etched in the wordline area. If RIE is employed, the sides of the wordlines will have silicon oxide, and the thickness of the bottom of the oxide can be controlled. In the case of an HF etch, silicon dioxide is etched and an additional dielectric may be deposited in certain embodiments. Optionally, a thick layer of approximately five nanometers of SiN or SiO may be deposited after the etch.

Next, a layer of tungsten or poly or another equivalent material is deposited. This layer is about 500 angstroms thick, for example. It is then chemically mechanically polished to the level of the gate barrier nitride. This is followed by TEOS deposition. After that, a (photolithographic) contact mask pattern is made (patterned and etched) for the bitline contact 154 and periphery contact 158. Alternatively, a two step mask and mask etch process can be utilized rather than a one step process. After that, another layer of tungsten or poly is deposited and etched back. Then another mask is made for a metallic layer and a TEOS etch is performed. The metal (tungsten, aluminum, or copper etc.) is deposited and then chemically mechanically polished. The resultant structure can be seen in FIG. 5D. Booster plate 110 can be seen between the various memory cells.

FIGS. 6A and 6B illustrate different embodiments of booster plate 110. As mentioned previously, booster plate 110 comprises fingers 110B and linking or connecting portion 110A. Plate 110 is connected to the booster plate transistor 120 and in turn to the control circuitry of the device.

It is claimed:

1. In a flash memory device having strings of transistors of a NAND architecture comprising a first select gate, a plurality of floating gates, and a second select gate, a method comprising:
   providing a plurality of wordlines perpendicular to the axes of the strings, each wordline of the plurality situated above floating gates of the strings; and
   providing a booster plate comprising a plurality of fingers and a portion linking the fingers, the fingers running parallel to the wordlines and located between adjacent wordlines but not covering an upper surface of the wordlines; and
   reading the charge stored on a floating gate under a selected wordline by applying a read voltage to a plurality of unselected wordlines and applying a voltage greater than the read voltage to the booster plate.

2. In a flash memory device having strings of transistors of a NAND architecture comprising a first select gate, a plurality of floating gates, and a second select gate, a method comprising:
   providing a plurality of wordlines perpendicular to the axes of the strings, each wordline of the plurality situated above floating gates of the strings; and
   providing a booster plate comprising a plurality of fingers and a portion linking the fingers, the fingers running parallel to the wordlines and located between but not over adjacent wordlines; and
   programming a selected floating gate by applying a first voltage level to a wordline above the selected floating gate while applying a second voltage level less than said programming voltage to unselected wordlines while also applying a third voltage level greater than or equal to the second voltage level but less than the first voltage level to the booster plate.

3. The method of claim 2, wherein providing the booster plate and applying the third voltage level to the booster plate reduces the first voltage level necessary to produce a given charge within the selected floating gate had the booster plate not been provided and the third voltage level not applied.

4. A method of reducing a program voltage level necessary to program a cell of a flash memory device comprising strings of memory cells, the strings comprising a plurality of floating gates, the method comprising:
   providing a plurality of wordlines perpendicular to the axes of the strings, each wordline of the plurality situated above floating gates of the strings;
   providing a booster plate;
   applying the program voltage to a wordline of the plurality located above a selected floating gate;
   applying a second voltage to the selected floating gate with the booster plate at the same time the program voltage is applied; and applying a third voltage to the wordlines located above one or more unselected floating gates, the level of the third voltage less than the level of the second voltage.

5. In a flash memory of a device with a NAND architecture having strings of transistors comprising a first select gate, a plurality of floating gates, and a second select gate, and wordlines perpendicular to the axes of the strings, each wordline of the plurality situated above floating gates of the strings, a method comprising:
   providing a booster plate comprising a plurality of fingers and a portion linking the fingers, the fingers running parallel to the wordlines and located between but not above adjacent wordlines; and
   applying a programming voltage having a first voltage level to a selected wordline, the first voltage level depending on the position of the wordline in the strings;
   applying a bias voltage to the booster plate, the bias voltage having a second voltage level, the second voltage level depending on the position of the selected wordline in the strings.

6. The method of claim 5, wherein if the selected wordline is the first wordline the bias voltage is equal to $V_{pass}$.

7. The method of claim 5, wherein if the selected wordline is the last wordline the bias voltage is equal to zero volts.

8. The method of claim 5, wherein if the selected wordline is in the center of the string, the bias voltage is equal to $V_{read}$.

9. The method of claim 5, wherein the first voltage level increments linearly from the first to last position in the string.

10. The method of claim 9, wherein the booster plate bias voltage increments linearly from the last to first position in the string.

11. The method of claim 5, wherein one of the first voltage level and the booster plate bias voltage drops while the other increases with an increasing position within the string.

* * * * *